(12) United States Patent  (10) Patent No.: US 8,079,797 B2
Tanaka et al.  (45) Date of Patent: Dec. 20, 2011

(54) SUBSTRATE PROCESSING SYSTEM AND SUBSTRATE TRANSFER METHOD

(75) Inventors: Osamu Tanaka, Tosu (JP); Takafumi Tsuchiya, Tosu (JP); Tohru Iwabae, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 615 days.

(21) Appl. No.: 12/285,777

(22) Filed: Oct. 14, 2008

(65) Prior Publication Data

US 2009/0097950 A1   Apr. 16, 2009

(30) Foreign Application Priority Data

Oct. 16, 2007  (JP) ................................. 2007-268741

(51) Int. Cl.
*B65G 49/07* (2006.01)
(52) U.S. Cl. ......... 414/222.13; 414/222.02; 414/222.07; 414/226.05; 414/416.02; 414/806; 414/811; 414/937; 700/219; 700/228
(58) Field of Classification Search ............. 414/222.13; 700/228
See application file for complete search history.

(56) References Cited

U.S. PATENT DOCUMENTS

| | | | | |
|---|---|---|---|---|
| 5,668,733 | A * | 9/1997 | Morimoto et al. | 414/222.13 |
| 5,700,127 | A * | 12/1997 | Harada et al. | 414/416.08 |
| 5,980,591 | A * | 11/1999 | Akimoto et al. | 29/25.01 |
| 6,275,744 | B1 * | 8/2001 | Yoshida | 700/218 |
| 6,507,770 | B2 * | 1/2003 | Tateyama et al. | 700/228 |
| 6,511,315 | B2 * | 1/2003 | Hashimoto | 432/121 |
| 6,584,369 | B2 * | 6/2003 | Patel et al. | 700/100 |
| 6,711,454 | B2 * | 3/2004 | Joma et al. | 700/121 |
| 6,889,108 | B2 * | 5/2005 | Tanaka et al. | 700/112 |
| 6,920,369 | B2 * | 7/2005 | Ueno et al. | 700/121 |
| 7,062,344 | B2 * | 6/2006 | Yokoyama et al. | 700/112 |
| 7,313,452 | B2 * | 12/2007 | Kobayashi et al. | 700/100 |
| 7,462,011 | B2 * | 12/2008 | Yamazaki et al. | 414/754 |
| 2008/0019809 | A1 * | 1/2008 | Takano | 414/222.01 |
| 2011/0029122 | A1 * | 2/2011 | Kaneko et al. | 700/110 |

FOREIGN PATENT DOCUMENTS

JP  2002-64075  2/2002

* cited by examiner

*Primary Examiner* — James Keenan
(74) *Attorney, Agent, or Firm* — Smith, Gambrell & Russell, LLP

(57) ABSTRACT

A substrate processing system includes a control section configured to control a series of transfer operations and preset to control operation of a container transfer apparatus, operation at a substrate access area, and operation of a substrate handling apparatus independently of each other. The control section includes a schedule creating portion configured to create a transfer schedule by individually adjusting operation timing of the container transfer apparatus, operation timing at the substrate access area, and operation timing of the substrate handling apparatus such that, in a state while a first lot of substrates are treated in the processing system, but the container transfer apparatus and the substrate access area are unoccupied, a container with a second lot of unprocessed substrates stored therein is transferred onto the substrate access area, thereby minimizing total transfer time.

16 Claims, 9 Drawing Sheets

SUBSTRATE PROCESSING SYSTEM AND SUBSTRATE TRANSFER METHOD

BACKGROUND OF THE INVENTION

1. Field of the Invention

The present invention relates to a substrate processing system for performing a batch process, such as a batch cleaning process, on substrates, such as semiconductor wafers;. The present invention also relates to a substrate transfer method used in the substrate processing system and a computer readable medium that stores a program for realizing the substrate transfer method.

2. Description of the Related Art

In the sequence of manufacturing semiconductor devices, a cleaning process is performed by treating a semiconductor wafer (which may be simply referred to as "wafer" hereinafter) with a process liquid, such as a predetermined chemical liquid or purified water to remove contaminants, such as particles, organic contaminants, and/or metal impurities, from the wafer.

As cleaning process systems for performing cleaning processes of this kind, batch type processing systems for processing a plurality of wafers together at a time are frequently used to improve the throughput. The batch cleaning process systems of this kind encompass systems of a FOUP-less type as a main stream in light of compactness of process vessels and shortening of the process time (for example, Jpn. Pat. Appln. KOKAI Publication No. 2002-64075). In the FOUP-less type, a plurality of semiconductor wafers stored in a FOUP (Front Open Unified Pod) are taken out from the FOUP, and are processed while they are held together and immersed in liquid inside a process vessel, so as to decrease the size of the process vessel and shorten the process time.

A batch cleaning process system of the FOUP-less type includes a load port section for loading and unloading FOUPs each storing a plurality of wafers, and for stocking the FOUPs. The system further includes a process section for performing a cleaning process on the wafers, and an interface section for transferring the wafers between the load port section and process section. For example, the system conducts the process sequence, as follows.

At first, a FOUP storing a plurality of wafers is transferred by a FOUP transfer apparatus disposed in the load port section to an access area between the load port section and interface section. Then, some operations are performed at the access area to, e.g., open the lid of the FOUP and to examine the array state of the wafers. Then, the wafers are taken out together from the FOUP by a handling apparatus disposed in the interface section, and are transferred at a wafer load position onto a wafer transfer mechanism for transferring the wafers to the process section. Then, the wafers are transferred by the wafer transfer mechanism to respective process vessels disposed in the process section. After the cleaning process, the wafers are transferred by the wafer transfer mechanism to a wafer unload position in the interface section. In the interface section, the wafers are picked up from the wafer transfer mechanism by the handling apparatus. In the load port section, an empty FOUP is transferred by the FOUP transfer apparatus to the access area, and the lid of the FOUP is then set opened. The wafers picked up from the wafer transfer mechanism by the handling apparatus disposed in the interface section are inserted in the FOUP in the access area. The FOUP with the wafers thus inserted is transferred by the FOUP transfer apparatus to a predetermined position in preparation for unloading.

A process sequence on one lot of wafers is thereby completed in accordance with the sequence described above. In this sequence, transfer of the wafers is controlled by collectively administrating a series of operations, such as the operation of the FOUP transfer apparatus in the load port section, the operations at the access area, such as opening/closing of the lid of the FOUP, and the operation of the wafer handling apparatus. In this way, the process is repeatedly performed on a plurality of lots at certain operation timings. This allows the cleaning process to be performed with simple control.

However, where a plurality of lots are sequentially performed by use of such a constant recipe, a subsequent lot of wafers needs to be loaded at a timing to prevent the schedules from overlapping with each other on the same apparatus at the same time. For example, even where the FOUP transfer apparatus is unoccupied, if a downstream portion of the transfer schedule, such as a schedule portion concerning the wafer handling apparatus, overlaps with the other, the subsequent lot of wafers cannot be loaded, but has to wait until an appropriate timing that prevents any overlap of use of the apparatuses. Consequently, the apparatuses cannot be effectively used in terms of their unoccupied periods, resulting in a decrease in the process throughput.

BRIEF SUMMARY OF THE INVENTION

An object of the present invention is to provide a substrate processing system which can improve the throughput in repeatedly performing a series of processes wherein a plurality of substrates are taken out from a container and are subjected to a predetermined process, and then the processed substrates are returned into a container. Another object of the present invention is to provide a substrate transfer method used in the substrate processing system and a computer readable medium that stores a program for realizing the substrate transfer method.

According to a first aspect of the present invention, there is provided a substrate processing system comprising: a container load port section for loading and unloading a container for storing a plurality of substrates; a substrate access area for taking out a plurality of unprocessed substrates from a container and for inserting processed substrates into an empty container; a container transfer apparatus configured to transfer a container between the container load port section and the substrate access area; a process section configured to perform a predetermined process on a plurality of substrates together; a substrate delivery area for loading a plurality of unprocessed substrates into the process section and for unloading processed substrates from the process section; a substrate handling apparatus configured to transfer substrates from a container at the substrate access area to the substrate delivery area and to transfer substrates from the substrate delivery area into a container at the substrate access area; a substrate transfer mechanism configured to transfer substrates between the substrate delivery area and the process section; and a control section configured to control a series of transfer operations of transferring a container that stores unprocessed substrates to the substrate access area and then transferring the unprocessed substrates from this container to the substrate delivery area, and of transferring an empty container to the substrate access area, then transferring processed substrates from the substrate delivery area into this empty container, and then transferring the container that stores the processed substrates, wherein the control section is preset to control the container transfer apparatus, an operation at the substrate access area, and the substrate handling apparatus independently of each other, and the control section includes a schedule creating portion configured to create a transfer schedule by individually adjusting operation timing of the container transfer apparatus, operation timing at the substrate access area, and operation timing of the substrate handling apparatus such that, in a state while a first lot of substrates are treated in the processing system, but the container transfer apparatus and the substrate access area are unoccupied, a container with a second lot of unprocessed substrates stored therein is transferred onto the substrate access area, thereby making total transfer time pertinent.

In the first aspect, where a transfer operation of the first lot overlaps with a transfer operation of the second lot, their operation timings may be adjusted by shifting one of the operation timings. The schedule creating portion may be designed to create a schedule to perform a loading operation of the second lot of substrates before starting an unloading operation of the first lot of substrates. The substrate access area may include a first stage for placing a container that stores unprocessed substrates and a second stage for placing an empty container that receives processed substrates, and the schedule creating portion may be designed to create a schedule to transfer a container that stores unprocessed substrates to the first stage to perform the loading operation of the second lot of substrates, immediately before transferring an empty container to the second stage to perform the unloading operation of the first lot of substrates.

The substrate delivery area may include a substrate loading position for loading unprocessed substrates into the process section and a substrate unloading position for unloading processed substrates from the process section. In this case, the substrate delivery area may include a first holding portion configured to receive substrates from the substrate handling apparatus, to hold unprocessed substrates of two containers with a half pitch that is a half of a substrate array pitch inside the containers, and to transfer the unprocessed substrates held with the half pitch onto the substrate transfer mechanism at the substrate loading position; and a second holding portion configured to receive processed substrates from the substrate transfer mechanism, which holds processed substrates arrayed with the half pitch, at the substrate unloading position, and to hold substrates corresponding to one container at a time, and the schedule creating portion may be designed to create a schedule to load unprocessed substrates by performing a series of operations of taking out unprocessed substrates of one container and transferring these substrates to the first holding portion, then performing the same operations for transferring unprocessed substrates from a subsequent container to the first holding portion, and arraying these substrates with the half pitch by the first holding portion; and to unload processed substrates by using the second holding portion to separate processed substrates of the two containers, arrayed with the half pitch, into two sets of substrates each corresponding to one container with the substrate array pitch inside the containers, then performing a series of operations of inserting one of the two sets of substrates into a container, and then performing the same operations for inserting the other of the two sets of substrates into another container.

The substrate handling apparatus may include substrate holding arms configured to hold substrates corresponding to one container and a multi-axial structure that allows the substrate holding arms to take an arbitrary position and posture in a three-dimensional space. The system may further comprise a lid opening/closing mechanism configured to open and close a lid of a container at the substrate access area, and a substrate examination apparatus configured to examine substrates inside a container at the substrate access area, and the operation at the substrate access area may comprise opening and closing of a lid of a container by the lid opening/closing mechanism and examination of substrates inside a container by the examination apparatus. The container load port section may include a container holding portion for temporarily placing a container.

According to a second aspect of the present invention, there is provided a substrate transfer method in a substrate processing system, the substrate processing system comprising a container load port section for loading and unloading a container for storing a plurality of substrates, a substrate access area for taking out a plurality of unprocessed substrates from a container and for inserting processed substrates into an empty container, a container transfer apparatus configured to transfer a container between the container load port section and the substrate access area, a process section configured to perform a predetermined process on a plurality of substrates together, a substrate delivery area for loading a plurality of unprocessed substrates into the process section and for unloading processed substrates from the process section, a substrate handling apparatus configured to transfer substrates from a container at the substrate access area to the substrate delivery area and to transfer substrates from the substrate delivery area into a container at the substrate access area, and a substrate transfer mechanism configured to transfer substrates between the substrate delivery area and the process section, the substrate transfer method comprising: transferring a container that stores unprocessed substrates to the substrate access area and then transferring the unprocessed substrates from this container to the substrate delivery area; transferring an empty container to the substrate access area, then transferring processed substrates from the substrate delivery area into this empty container, and then transferring the container that stores the processed substrates; and individually adjusting operation timing of the container transfer apparatus, operation timing at the substrate access area, and operation timing of the substrate handling apparatus such that, in a state while a first lot of substrates are treated in the processing system, but the container transfer apparatus and the substrate access area are unoccupied, a container with a second lot of unprocessed substrates stored therein is transferred onto the substrate access area, thereby making total transfer time pertinent.

In the second aspect, where a transfer operation of the first lot overlaps with a transfer operation of the second lot, their operation timings may be adjusted by shifting one of the operation timings. The method may be arranged to perform a loading operation of the second lot of substrates before starting an unloading operation of the first lot of substrates. The substrate access area may include a first stage for placing a container that stores unprocessed substrates and a second stage for placing an empty container that receives processed substrates, and the method may be arranged to transfer a container that stores unprocessed substrates to the first stage to perform the loading operation of the second lot of substrates, immediately before transferring an empty container to the second stage to perform the unloading operation of the first lot of substrates.

The substrate delivery area may include a substrate loading position for loading unprocessed substrates into the process section and a substrate unloading position for unloading processed substrates from the process section. In this case, the substrate delivery area may include a first holding portion configured to receive substrates from the substrate handling apparatus, to hold unprocessed substrates of two containers with a half pitch that is a half of a substrate array pitch inside the containers, and to transfer the unprocessed substrates held with the half pitch onto the substrate transfer mechanism at the substrate loading position, and a second holding portion configured to receive processed substrates from the substrate transfer mechanism, which holds processed substrates arrayed with the half pitch, at the substrate unloading position, and to hold substrates corresponding to one container at a time, and the method may be arranged to load unprocessed substrates by performing a series of operations of taking out unprocessed substrates of one container and transferring these substrates to the first holding portion, then performing the same operations for transferring unprocessed substrates from a subsequent container to the first holding portion, and arraying these substrates with the half pitch by the first holding portion; and to unload processed substrates by using the second holding portion to separate processed substrates of the two containers, arrayed with the half pitch, into two sets of substrates each corresponding to one container with the substrate array pitch inside the containers, then performing a series of operations of inserting one of the two sets of substrates into a container, and then performing the same operations for inserting the other of the two sets of substrates into another container.

According to a third aspect of the present invention, there is provided a computer readable medium containing a program for controlling transfer of substrates in a substrate processing system, the substrate processing system comprising a container load port section for loading and unloading a container for storing a plurality of substrates, a substrate access area for taking out a plurality of unprocessed substrates from a container and for inserting processed substrates into an empty container, a container transfer apparatus configured to transfer a container between the container load port section and the substrate access area, a process section configured to perform a predetermined process on a plurality of substrates together, a substrate delivery area for loading a plurality of unprocessed substrates into the process section and for unloading processed substrates from the process section, a substrate handling apparatus configured to transfer substrates from a container at the substrate access area to the substrate delivery area and to transfer substrates from the substrate delivery area into a container at the substrate access area, and a substrate transfer mechanism configured to transfer substrates between the substrate delivery area and the process section, wherein the program, when executed, causes a computer to control the substrate processing system to conduct a substrate transfer method comprising: transferring a container that stores unprocessed substrates to the substrate access area and then transferring the unprocessed substrates from this container to the substrate delivery area; transferring an empty container to the substrate access area, then transferring processed substrates from the substrate delivery area into this empty container, and then transferring the container that stores the processed substrates; and individually adjusting operation timing of the container transfer apparatus, operation timing at the substrate access area, and operation timing of the substrate handling apparatus such that, in a state while a first lot of substrates are treated in the processing system, but the container transfer apparatus and the substrate access area are unoccupied, a container with a second lot of unprocessed substrates stored therein is transferred onto the substrate access area, thereby making total transfer time pertinent.

Additional objects and advantages of the invention will be set forth in the description which follows, and in part will be obvious from the description, or may be learned by practice of the invention. The objects and advantages of the invention may be realized and acquired by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings. In this embodiment, an explanation will be made of a case where the present invention is applied to a cleaning process system configured to consistently perform loading, liquid-processing, drying, and unloading on a batch of semiconductor wafers (wafers).

Figure 1:
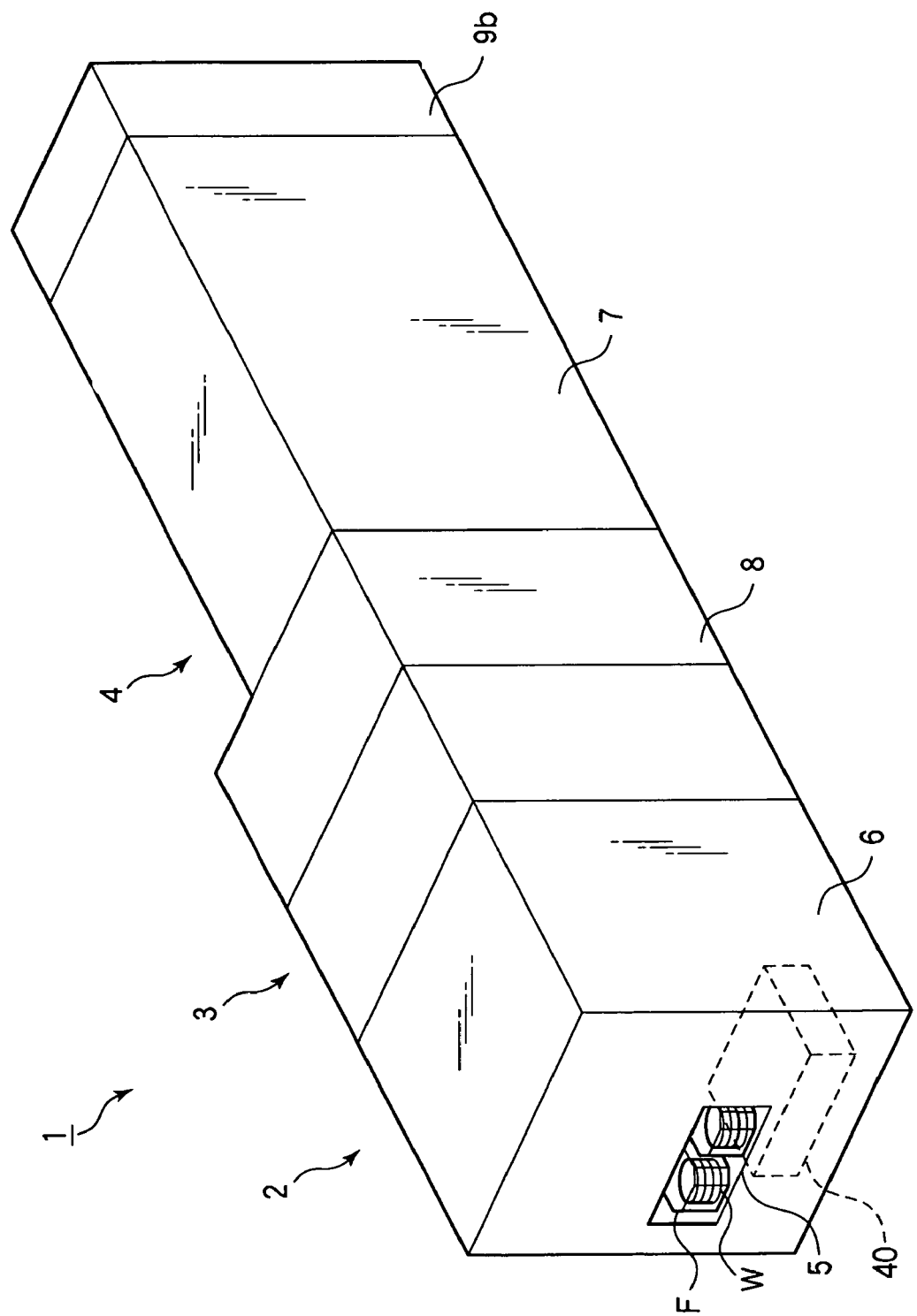
FIG. 1 is a perspective view showing a cleaning process system according to an embodiment of the present invention.
Figure 2:
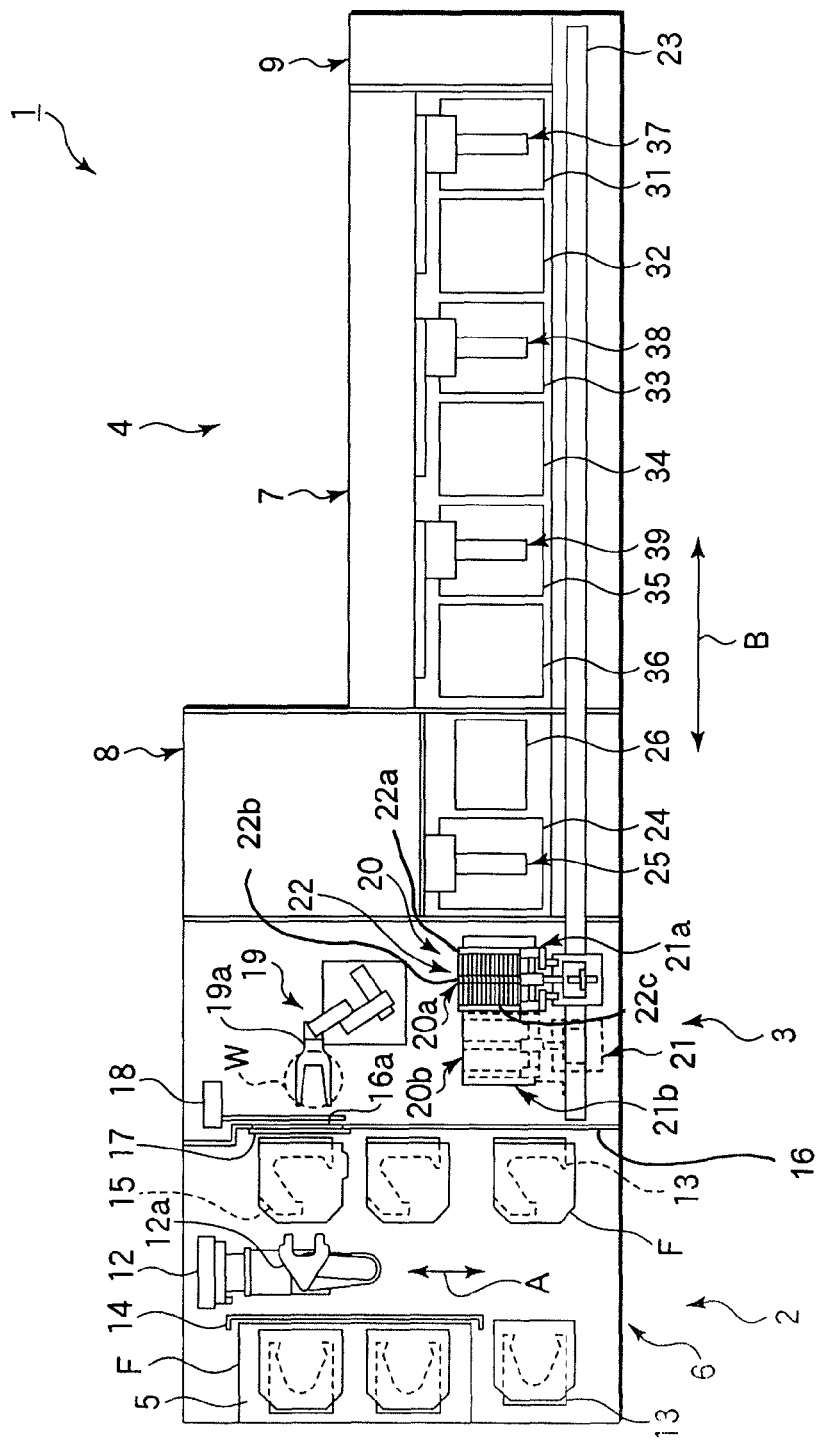
FIG. 2 is a plan view showing the cleaning process system according to an embodiment of the present invention.

FIG. 1 is a perspective view showing a cleaning process system according to an embodiment of the present invention. FIG. 2 is a plan view showing the cleaning process system. As shown in FIGS. 1 and 2, this liquid processing system 1 is formed mainly of a FOUP load port section 2, an interface section 3, and a cleaning process section 4. The FOUP load port section 2 is used for loading and unloading FOUPs F serving as wafer containers each storing wafers W in a horizontal state, and for stocking the FOUPs. The cleaning process section 4 is used for performing a cleaning process on the wafers W by use of a predetermined chemical liquid, and for performing a drying process on the wafers W after the cleaning process. The interface section 3 is used for transferring the wafers between the FOUP load port section 2 and cleaning process section 4.

The FOUP load port section 2 includes a FOUP load stage 5 for placing thereon FOUPs F each storing a predetermined number of, such as 25, wafers W in a horizontal state at predetermined intervals. The FOUP load port section 2 further includes a FOUP stock area 6 for stocking the FOUPs F, and a FOUP transfer apparatus 12 for transferring the FOUPs.

Each FOUP F has a load opening for wafers W, formed on one side and provided with a lid for opening and closing the load opening. The FOUP stock area 6 has a plurality of holding members 13 each for holding a FOUP F, so that a plurality of FOUPs F can be stocked.

A shutter 14 is disposed between the FOUP load stage 5 and FOUP stock area 6, and is set in a closed state during a period other than a time when FOUPs F are loaded and unloaded to and from the FOUP load stage 5.

The FOUP stock area 6 and interface section 3 are partitioned by a wall 16, which has window portions 16a formed therein on upper and lower sides (only one of them is shown). The window portions 16a are respectively provided with wafer access stages (substrate access area) 15 disposed on upper and lower sides (only one of them is shown), each extending toward the FOUP stock area 6 to place thereon a FOUP F such that the lid of the FOUP F faces the corresponding window portion 16a. The upper window portion 16a is used for wafer loading, and the lower window portion 16a is used for wafer unloading. Each of the wafer access stages 15 is provided with an opening/closing mechanism 17 for opening and closing the lid of a FOUP F placed thereon. In a state where the FOUP F is in a close contact with the wall 16, the lid is opened, so that the wafers W inside the FOUP F can be taken out to the interface section 3. In reverse, in the same state, wafers W can be inserted in an empty FOUP F from the interface section 3.

In FIG. 2, a plurality of, such as 4, FOUP holding members 13 are arrayed at intervals in the vertical direction near a wall surface defining the FOUP stock area 6. The FOUP stock area 6 serves to temporarily store FOUPs F that store wafers W before a cleaning process, and to store empty FOUPs F after the wafers W are taken out therefrom.

The FOUP transfer apparatus 12 has an articulated structure with a support arm 12a at the distal end for supporting and transferring a FOUP F. The FOUP transfer apparatus 12 is also movable in a direction A in FIG. 2 and a vertical direction, so as to transfer a FOUP F among the FOUP load stage 5, holding members 13, and wafer access stages 15.

A wafer examination apparatus 18 is disposed in the interface section 3 near the window portions 16a and is configured to measure the number of wafers W in a FOUP F. For example, the wafer examination apparatus 18 includes an infrared sensor head configured to perform a scanning operation in a vertical direction near the wafers W stored in the FOUP F, thereby examining the wafers W.

The interface section 3 includes a wafer handling apparatus 19 and a wafer delivery area 20, which are used for transferring wafers.

The wafer handling apparatus 19 is used for transferring wafers W to and from a FOUP F placed on each of the wafer access stages 15, and for transferring wafers W to and from an arraying setup 21. The wafer handling apparatus 19 has a multi-axial arm structure with wafer holding arms 19a at the distal end that can support the same number of wafers W as that of the wafers W stored in one FOUP F. Each of the wafer holding arms 19a is provided with a gripping hook (not shown) for holding a wafer W. While wafers W are held by the gripping hooks, the wafer holding arms 19a can take an arbitrary position and posture in the three-dimensional space by the multi-axial arm structure.

The wafer delivery area 20 is used for transferring wafers W between the interface section 3 and cleaning process section 4. The wafer delivery area 20 includes a load position 20a, an unload position 20b, and the arraying setup 21.

The arraying setup 21 includes a first arraying mechanism 21a and a second arraying mechanism 21b. The first arraying mechanism 21a is configured to array unprocessed wafers W of two FOUPs, such as 50 unprocessed wafers W, supplied from the wafer handling apparatus 19, with a pitch (half pitch) that is a half of the pitch inside the FOUPs F. The second arraying mechanism 21b is configured to return the pitch of wafers W from the half pitch to the pitch (normal pitch) inside the FOUPs F, after the wafers W are processed by the cleaning process with the half pitch.

Figure 3:
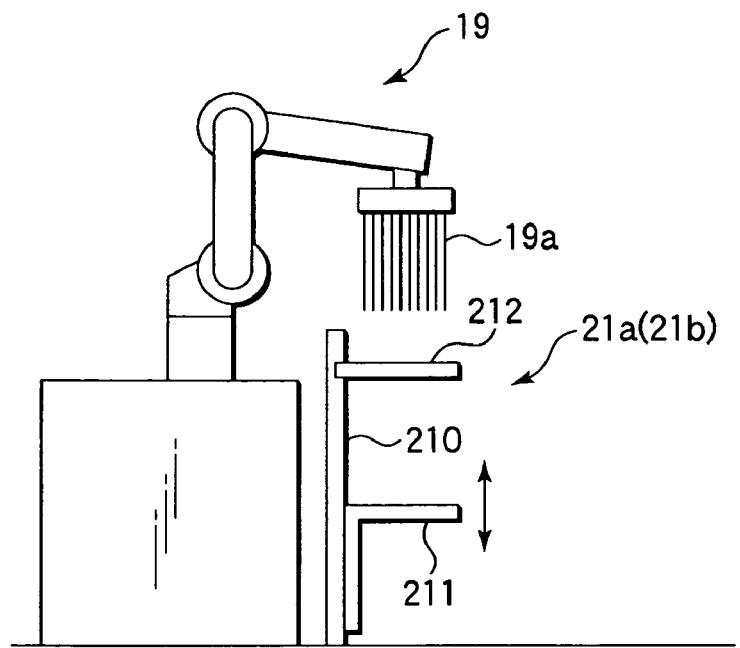
FIG. 3 is a side view showing an arraying setup in a wafer delivery area and a wafer handling apparatus.

The first arraying mechanism 21a and second arraying mechanism 21b of the arraying setup 21 have the same structure. As shown in FIG. 3, each of them includes a guide 210 extending in a vertical direction, and a wafer hand 211 having wafer holding grooves arrayed with the half pitch and movable up and down relative to the guide 210. Further, the arraying mechanism includes a wafer holder 212 configured to hold wafers of one FOUP and to allow the wafer hand 211 to pass therethrough in the vertical direction.

Figure 4:
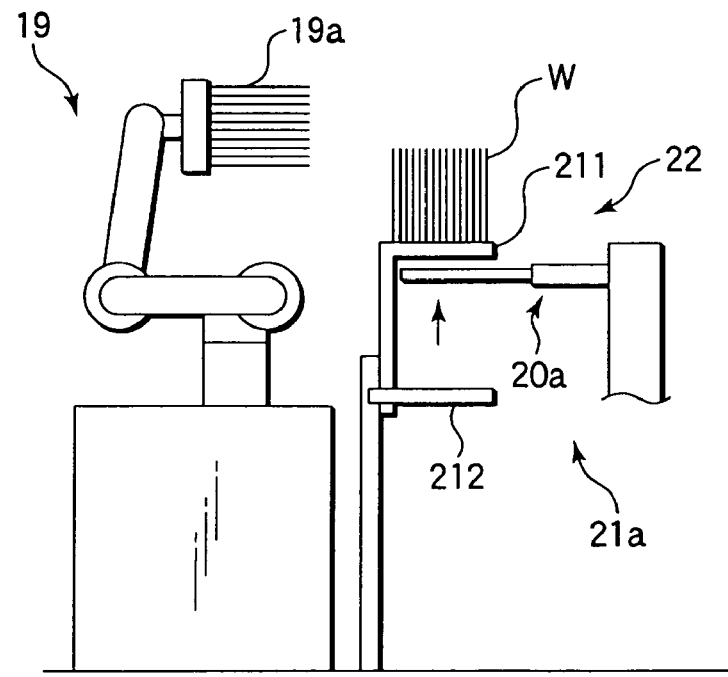
FIG. 4 is a view showing a state where two lots of wafers are transferred from a first arraying mechanism of the arraying setup to a wafer transfer mechanism.

When wafers W are transferred (loaded) into the cleaning process section 4, the wafer holding arms 19a of the wafer handling apparatus 19 are inserted into a FOUP F placed on one of the wafer access stages 15. The wafer holding arms 19a receive the wafers W in a horizontal posture, and then place the wafers W in vertical posture onto the wafer hand 211 of the first arraying mechanism 21a from above. At this time, the wafer hand 211 is set at a position above the wafer holder 212. When the wafer holding arms 19a of the wafer handling apparatus 19 receive wafers from the subsequent FOUP F, and place them onto the wafer holder 212, the wafer holder 212 is set at a position above the first arraying mechanism 21a. Then, from this state, as shown in FIG. 4, the wafer hand 211 is moved up from below, so that the wafer hand 211 receives the wafers W from the wafer holder 212 and thereby realizes an array of wafers with the half pitch. Then, the wafer transfer mechanism 22 is set at the load position 20a directly below the wafer hand 211 that hold a plurality of, such as 50, wafers W with the half pitch as described above. Then, the wafer hand 211 is moved down, so that the wafers of the two FOUPs and arrayed with the half pitch are placed onto the wafer transfer mechanism 22 with the half pitch.

When the wafers W are transferred out (unloaded) after the cleaning, the wafer transfer mechanism 22, which holds the cleaned wafers W of the two FOUPs with the half pitch, is set at the unload position 20b. Then, the wafers are transferred from the wafer transfer mechanism 22 onto the wafer hand 211 of the second arraying mechanism 21b. Then, the wafer hand 211 is moved down, during which a half of the wafers are received by the wafer holder 212. Consequently, each of the wafer holder 212 and wafer hand 211 holds a set of wafers of one FOUP with the normal pitch. Then, the wafer holding arms 19a of the handling apparatus 19 insert each set of wafers in a horizontal posture into an empty FOUP F on one of the wafer access stages 15.

The wafer transfer mechanism 22 includes three chucks 22a to 22c having wafer holding grooves formed therein with the half pitch, so that wafers W of two FOUPs can be held with the half pitch. The wafer transfer mechanism 22 is movable in a direction indicated with an arrow B in FIG. 2 on a guide rail 23 extending from the interface section 3 to the cleaning process section 4. The wafer transfer mechanism 22 receives unprocessed wafers W in a vertical posture at the load position 20a of the load/unload area 20 from the wafer handling apparatus 19. The wafer transfer mechanism 22 is moved along the guide rail 23 into the cleaning process section 4 to load the wafer into the cleaning process section 4. In reverse, after the cleaning process, the wafer transfer mechanism 22 unloads the wafers W from the cleaning process section 4 and is moved along the guide rail 23 to the unload position 20b of the load/unload area 20, at which the wafer transfer mechanism 22 transfers the processed wafers W onto the wafer handling apparatus 19.

The cleaning process section 4 includes a cleaning process unit 7, a drying unit 8, and a parking area 9. From the interface section 3 side, the drying unit 8, cleaning process unit 7, and parking area 9 are arrayed in this order. The wafer transfer mechanism 22 is movable on a guide rail 23 extending in an X-direction to transfer wafers W among these portions.

The parking area 9 is used for unprocessed wafers W to wait. By use of the time when the wafer transfer mechanism 22 is not required to operate because a liquid process or drying process is performed on one lot of wafers W, subsequent wafers W to be processed by the liquid process are transferred to the parking area 9. Since the parking area 9 is adjacent to the cleaning process unit 7, the travel time of the wafers W to start the cleaning process is short, thereby improving the throughput.

As shown in FIG. 2, the cleaning process unit 7 includes a first chemical liquid vessel 31, a first water washing vessel 32, a second chemical liquid vessel 33, a second water washing vessel 34, a third chemical liquid vessel 35, and a third water washing vessel 36 arrayed in this order from the parking area 9 side. Further, the cleaning process unit 7 includes a first transfer apparatus 37 for transferring wafers W between the first chemical liquid vessel 31 and first water washing vessel 32, a second transfer apparatus 38 for transferring wafers W between the second chemical liquid vessel 33 and second water washing vessel 34, and a third transfer apparatus 39 for transferring wafers W between the third chemical liquid vessel 35 and third water washing vessel 36.

The first chemical liquid vessel 31 stores, e.g., an SPM liquid (a mixed solution of concentrated sulfuric acid and hydrogen peroxide solution) heated at about 130° C. to remove organic contaminants and/or surface metal impurities. The second chemical liquid vessel 33 stores a chemical liquid, such as an SC-1 liquid (a mixed solution of ammonia, hydrogen peroxide, and water), to remove deposits, such as particles. The third chemical liquid vessel 35 stores an etching liquid, such as diluted hydrofluoric acid, to etch an oxide film formed on the surface of wafers W. The etching liquid may be a mixture of hydrofluoric acid and ammonium fluoride (buffered hydrofluoric acid (BHF)), in place of diluted hydrofluoric acid.

The first to third water washing vessels 32, 34, and 36 are used to remove chemical liquids deposited on wafers W due to liquid processes in the first to third chemical liquid vessels 31, 33, and 35, respectively. For this purpose, various water washing methods, such as overflow rinsing and quick damp rinsing, can be used.

The first transfer apparatus 37 includes a drive mechanism movable up and down. The first transfer apparatus 37 moves down wafers W received from the wafer transfer mechanism 22 to immerse them in the liquid inside the first chemical liquid vessel 31 and then moves up the wafers W therefrom after a predetermined time has elapsed. Then, the first transfer apparatus 37 transfers the wafers W in a horizontal direction, immerses the wafers W in the liquid inside the first water washing vessel 32 and then moves up the wafers W therefrom after a predetermined time has elapsed. After the wafers W are processed in the first water washing vessel 32, they are once returned to the chucks 22a to 22c of the wafer transfer mechanism 22, and then they are transferred from the wafer transfer mechanism 22 to second transfer apparatus 38. The second and third transfer apparatuses 38 and 39 have the same structure and are operated in the same way as in the first transfer apparatus 37.

The drying unit 8 includes a water washing vessel 24 and a chuck cleaning mechanism 26 for cleaning the chucks 22a to 22c of the wafer transfer mechanism 22. A drying chamber (not shown) is disposed above the water washing vessel 24 and is configured to supply, e.g., vapor of isopropyl alcohol (IPA) to dry wafers W. A transfer apparatus 25 is disposed to transfer wafers W between the water washing vessel 24 and drying chamber. After wafers W are processed by water washing in the water washing vessel 24, the wafers are moved up by the transfer apparatus 25 and are subjected to IPA drying in the drying chamber. Except for being unmovable in the horizontal direction, the transfer apparatus 25 has the same structure as the first transfer apparatus 37 to transfer wafers W to and from the wafer transfer mechanism 22.

Figure 5:
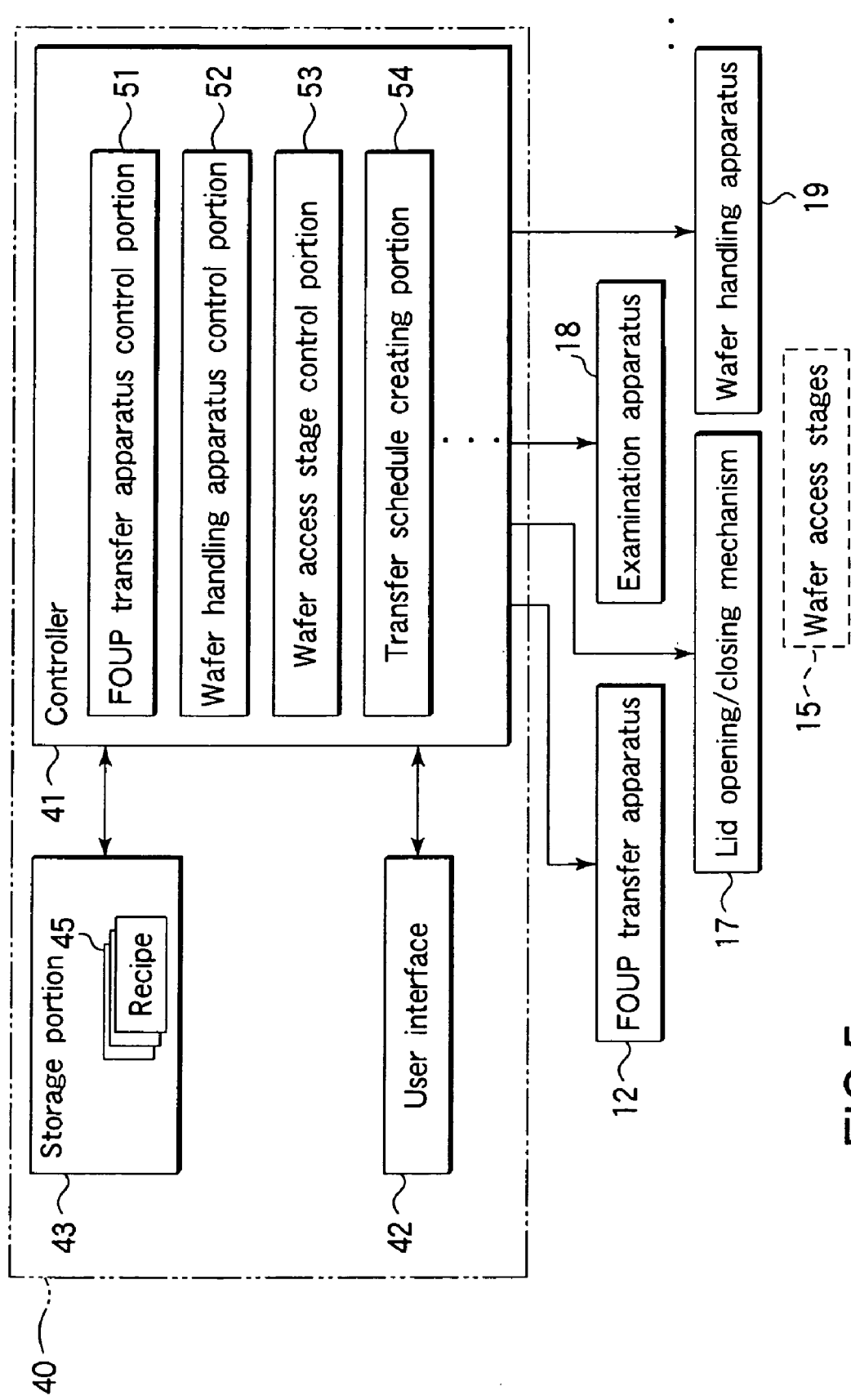
FIG. 5 is a block diagram showing a control section used in the cleaning process system according to an embodiment of the present invention.

A control section 40 is disposed below the load port section 2. As shown in FIG. 5, the control section 40 includes a controller 41 comprising a microprocessor (MPU) for controlling the respective components of the cleaning process system 1, such as the FOUP transfer apparatus 12, wafer access stages 15, wafer handling apparatus 19, and wafer transfer mechanism 22. Further, the control section 40 includes a user interface 42 and a storage portion 43 that stores data necessary for performing processes.

The user interface 42 and storage portion 43 are connected to the controller 41. The user interface 42 includes a keyboard, a display, and so forth, wherein the keyboard is used for an operator to input commands for operating the respective components of the cleaning process system 1, and the display is used for showing visualized images of the operational status of the respective components of the cleaning process system 1. The storage portion 43 stores recipes 45, i.e., control programs for the process controller 41 to control the cleaning process system 1 so as to perform various processes, and programs for the respective components of the cleaning process system 1 to perform predetermined processes in accordance with process conditions. The control programs of the recipes and so forth are recorded in the storage medium of the storage portion 43. The storage medium may be of the stationary type, such as a hard disk, or of the portable type, such as a CDROM, DVD, or flash memory.

As described above, the control section 40 is preset to control the cleaning process system 1 as a whole. Next, an explanation will be given mainly of control of a transfer system for the FOUP transfer apparatus 12, wafer handling apparatus 19, and so forth, which relates to the core part of this embodiment.

The controller 41 includes a FOUP transfer apparatus control portion 51, a wafer handling apparatus control portion 52, a wafer access stage control portion 53, and a transfer schedule creating portion 54. The FOUP transfer apparatus control portion 51 is arranged to control the FOUP transfer apparatus 12 in the load port section 2. The wafer handling apparatus control portion 52 is arranged to control the wafer handling apparatus 19 in the interface section 3. The wafer access stage control portion 53 is arranged to control operations at the wafer access stages 15, such as opening and closing operations of the lid of a FOUP F by the lid opening/closing mechanism 17 and operations of the wafer examination apparatus 18. The transfer schedule creating portion 54 is arranged to create optimum transfer schedules in accordance with recipes stored in the storage portion 43.

A described above, the transfer schedule creating portion 54 can create an optimum transfer schedule in accordance with a recipe selected from a plurality of recipes stored in the storage portion 43. For example, where the unloading schedule of a first lot of wafers W and the loading schedule of a second lot of wafers W are intricate, the transfer schedules of the first lot of wafers and second lot of wafers W are optimized.

Next, an explanation will be given of process operations of the cleaning process system 1 having a structure described above, while focusing on the transfer sequences of FOUPs F and wafers W.

At first, two FOUPs F, each storing a predetermined number of, such as 25, wafers W in a horizontal state, are placed on the FOUP load stage 5. Then, a series of processes is performed on the wafers W of the two FOUPs F, in accordance with recipes stored in the storage portion 43.

Figure 6:
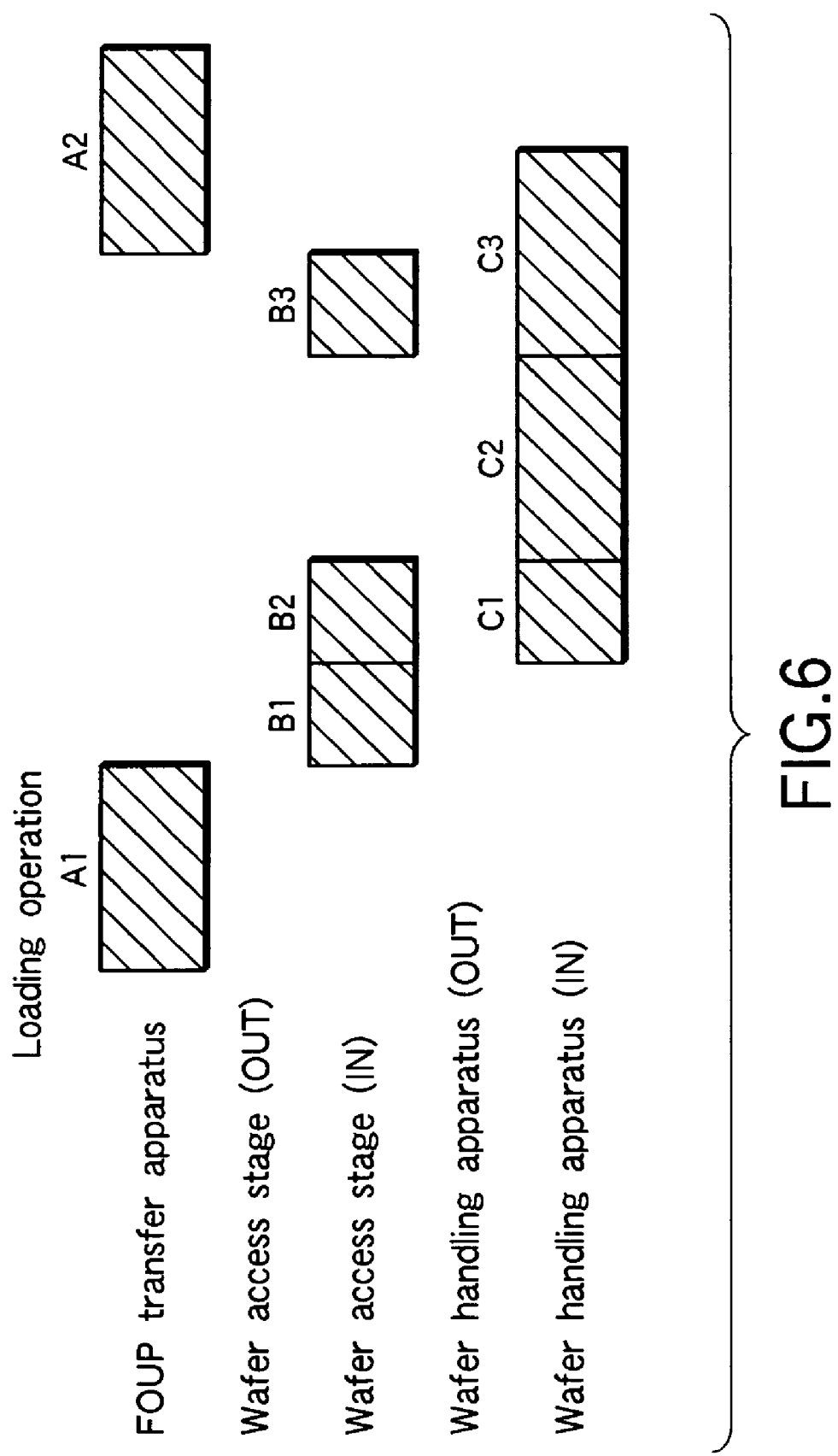
FIG. 6 is a timing chart showing a transfer sequence for wafer loading.

FIG. 6 is a timing chart showing a transfer sequence for wafer loading. At first, one of the FOUPs F placed on the FOUP load stage 5 is transferred by the FOUP transfer apparatus 12 onto one of the wafer access stages 15 for loading (operation A1). Where a plurality of lots substrates are repeatedly transferred, a FOUP F may be once stored on one of the FOUP holding members 13 in the FOUP stock area 6 and then transferred, as needed. Then, the FOUP F placed on this wafer access stage 15 is treated by the lid opening/closing mechanism 17 to unlock and open the lid of the FOUP F (operation B1). Then, measurement of the number of wafers and so forth are performed by the wafer examination apparatus 18 (operation B2). Along with this examination, a preparatory operation of the wafer handling apparatus 19 is performed (operation C1). After the examination is finished, the wafer holding arms 19a of the wafer handling apparatus 19 are inserted through the corresponding one of the window portions 16a into the FOUP F placed on this wafer access stage 15. Then, the wafers W are taken out therefrom by the wafer handling apparatus 19 (operation C2) and are placed on the wafer hand 211 of the first arraying mechanism 21a of the arraying setup 21 (operation C3). Simultaneously with this operation C3, the FOUP F placed on this wafer access stage 15, after the wafers W are taken out therefrom, is treated by the lid opening/closing mechanism 17 to attach the lid to the FOUP F (operation B3). Then, the FOUP F is transferred by the FOUP transfer apparatus 12 onto one of the FOUP holding members 13 (operation A2).

The same operations are performed on the other FOUP F placed on the FOUP load stage 5. Specifically, the other FOUP F is transferred onto this wafer access stage 15 (operation A1). Then, the wafers W are taken out from this FOUP F by the wafer holding arms 19a of the wafer handling apparatus 19 and are placed on the first arraying mechanism 21a (operations C1 to C3). At this time, as described above, in the first arraying mechanism 21a, the wafers W are placed on the wafer holder 212 and then the wafer hand 211 is moved up, so that the wafers W on the wafer holder 212 are inserted into the gaps between the wafers W placed on the wafer hand 211. Consequently, a plurality of, such as 50, wafers W of the two FOUPs are held on the wafer hand 211 with the half pitch. These wafers W are then placed onto the wafer transfer mechanism 22.

Then, these wafers W of the two FOUPs placed on the wafer transfer mechanism 22 are treated as one lot and are transferred to the cleaning process section to perform a predetermined cleaning process.

In this process, the wafer transfer mechanism 22 with the wafers W held thereon is moved along the guide rail 23 to a position corresponding to the first chemical liquid vessel 31 or first water washing vessel 32 in the liquid process unit 7; Then, the wafers W are transferred onto the first transfer apparatus 37, and the cleaning process of the wafers W is started. For example, the liquid process of the wafers comprises immersion by the first chemical liquid vessel 31, cleaning by the first water washing vessel 32, immersion by the second chemical liquid vessel 33, cleaning by the second water washing vessel 34, immersion by the third chemical liquid vessel 35, and cleaning by the third water washing vessel 36 in this order.

After the process is finished in the liquid process unit 7, the wafers W are once transferred onto the wafer transfer mechanism 22, and then transferred onto the transfer apparatus 25 in the drying unit 8 to perform a drying process thereon. After the drying process is finished, the wafers W, which are, e.g., 50 wafers of the two FOUPs, are transferred to the unload position 20b in the interface section 3, while they are held in a vertical posture on the wafer transfer mechanism 22 with the half pitch.

After the wafers W are transferred to the unload position 20b, they are transferred onto the wafer hand 211 of the second arraying mechanism 21b, while the wafers of the two FOUPs are still arrayed with the half pitch. Then, the wafer hand 211 is moved down, and a set of wafers W of one FOUP are thereby transferred, so that each of the wafer holder 212 and wafer hand 211 holds a set of wafers of one FOUP with the normal pitch.

Figure 7:
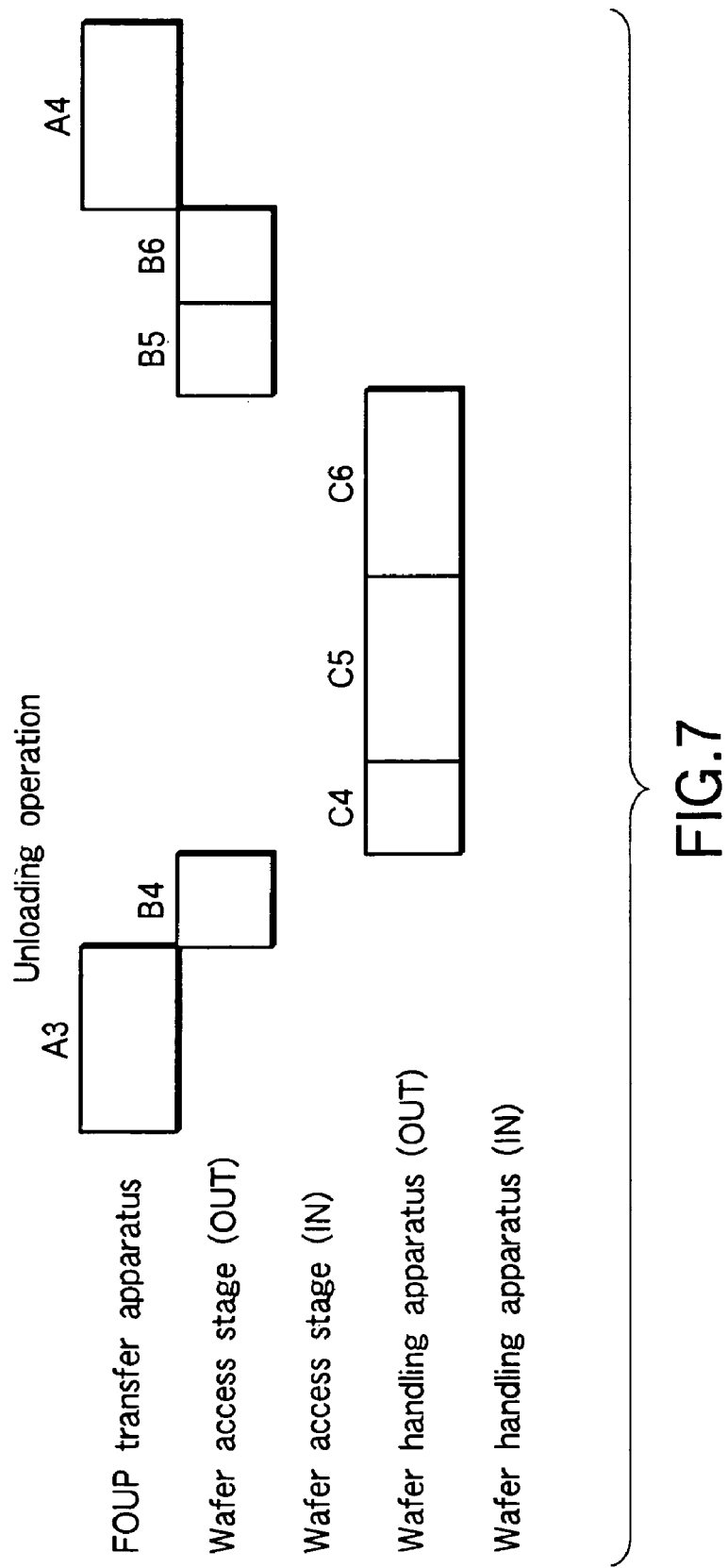
FIG. 7 is a timing chart showing a transfer sequence for wafer unloading.

FIG. 7 is a timing chart showing a transfer sequence for wafer unloading from this state. When an unloading operation of the wafers thus held on the second arraying mechanism 21b is performed, at first, an empty FOUP F is placed by the FOUP transfer apparatus 12 onto one of the wafer access stages 15 for unloading (operation A3), and the lid of the FOUP F is set open by the lid opening/closing mechanism 17 (operation B4). Then, a preparatory operation of the wafer handling apparatus 19 is performed (operation C4). Then, the wafer holding arms 19a are inserted into the first arraying mechanism 21a, and take out the wafers from the wafer hand 211 held in a vertical posture (operation C5). Then, the wafer holding arms 19a with the wafers W held thereon are inserted into the FOUP F placed on the unloading wafer access stage, and place the wafers W therein in a horizontal posture (operation C6). Thereafter, the wafer holding arms 19a are moved out of the FOUP F, and then the wafers W in the FOUP F are examined by the wafer examination apparatus 18 (operation B5). After the examination is finished, the lid of the FOUP F is closed by the lid opening/closing mechanism 17 (operation B6). Consequently, the unloading operation of the first set of wafers is finished. Then, the FOUP F that stores the wafers W thus processed by the cleaning process is transferred by the FOUP transfer apparatus 12 onto one of the FOUP holding members 13 (operation A4) and held thereon.

The same operations are performed on the wafers W on the wafer holder 212. Specifically, operations of, e.g., placing an empty FOUP F on the unloading wafer access stage 15 are performed (operations A3 and so forth). Then, the predetermined operations of the wafer handling apparatus 19 are performed (operation C4 to C6), so that the wafers W are transferred from the wafer holder 212 into the empty FOUP F. Then, predetermined processes are further performed (operations B5 and B6).

In this way, a series of processes on the first lot of wafers W are completed.

Figure 8:
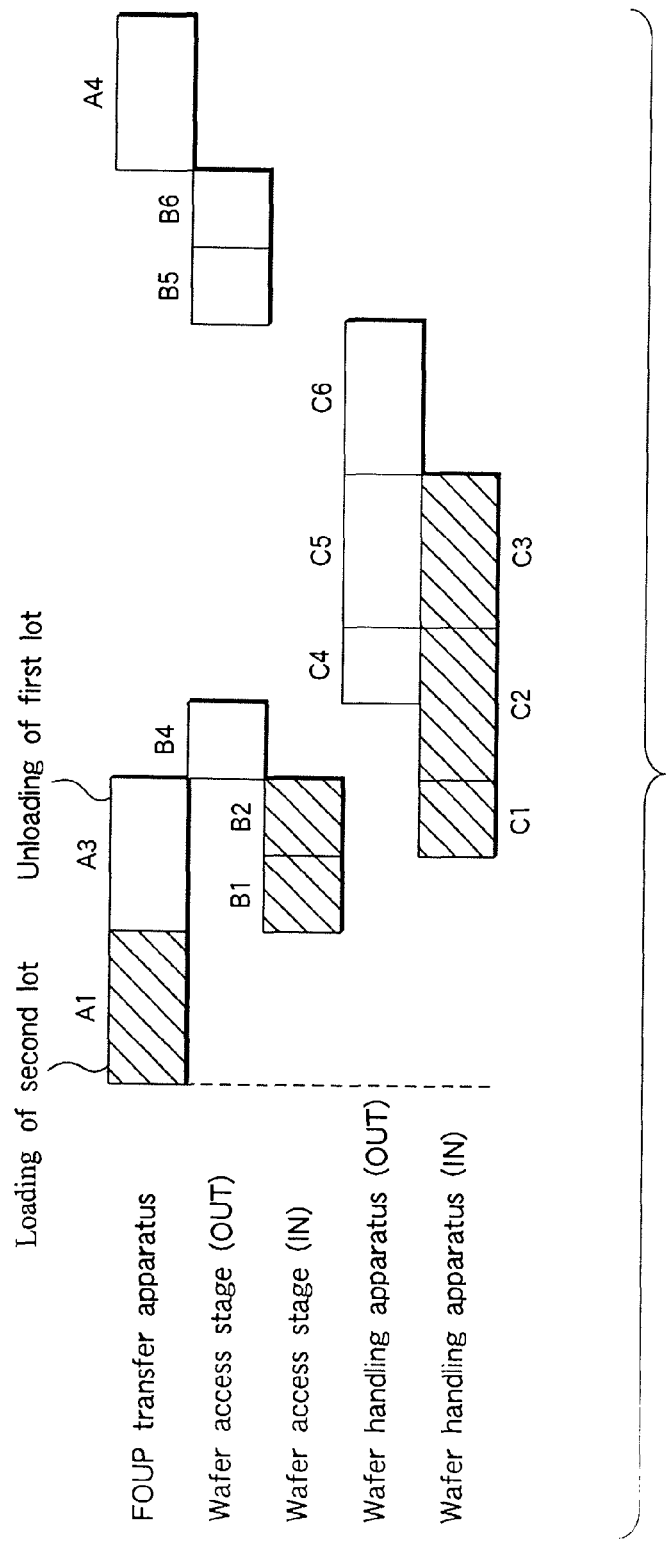
FIG. 8 is a timing chart showing an example where a predetermined transfer schedule cannot be executed by a conventional control method.

Thereafter, a second lot is loaded. At this time, the transfer schedule of the second lot needs to be determined so as not to overlap with the transfer schedule of the unloading operation of the first lot. In this respect, it is safest to load the second lot after the unloading operation of the first lot is finished. However, in this case, the waiting time for the FOUP transfer apparatus 12, lid opening/closing mechanism 17, examination apparatus 18, and/or wafer handling apparatus 19 is extended too much, resulting in a very low throughput. In light of this, it is necessary to create a transfer sequence that can improve the throughput to the utmost. For example, in the unloading operation of the first lot, before the operation A3 of the FOUP transfer apparatus 12, the FOUP transfer apparatus 12 and loading wafer access stage 15 are unoccupied. Accordingly, this period may be effectively utilized to perform the transfer operation of the FOUP F of the second lot (operation A1). However, conventionally, the operation of the FOUP transfer apparatus 12, the operation of the lid opening/closing mechanism 17 at the wafer access stages 15, the operation of the examination apparatus 18, and the operation of the wafer handling apparatus 19 are collectively controlled, and their process schedules are determined in advance. In this case, as shown in FIG. 8, the first part of the schedule for the second lot at the wafer handling apparatus 19 concerning the wafer take-out operation (operation C2) from the FOUP and the wafer transfer operation (operation C3) onto the wafer transfer mechanism 22 overlaps with part of the predetermined schedule for the first lot at the wafer handling apparatus 19 concerning the preparatory operation (operation C4) and the wafer receiving operation (operation C5). Consequently, loading of the second lot of wafers cannot be performed with this timing, i.e., an unoccupied period of the FOUP transfer apparatus 12 cannot be effectively utilized.

Figure 9:
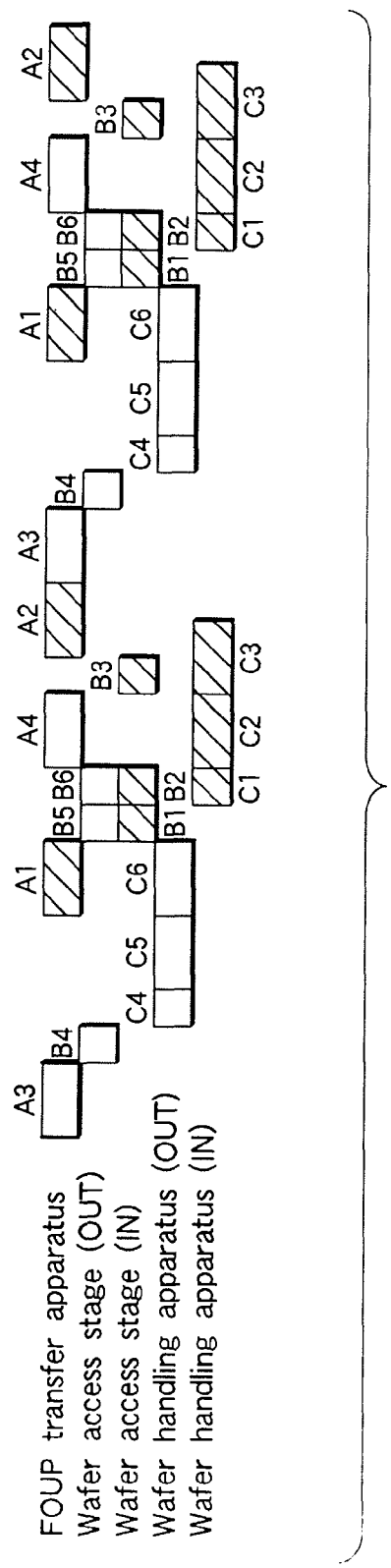
FIG. 9 is a timing chart showing a transfer sequence which can be created by a conventional control method.

Therefore, conventionally, as shown in FIG. 9, the loading start timing of the second lot of wafers W (the operation A1 by the FOUP transfer apparatus 12) is inevitably delayed until the transfer operation (operation C6) of the wafers W into a FOUP on the wafer access stage 15 is finished by the wafer handling apparatus 19. This prolongs the transfer sequence, thereby lowering the throughput.

According to this embodiment made in light of this problem, the control of the FOUP transfer apparatus 12, the control of operations at the wafer access stages 15 (the control of the lid opening/closing mechanism 17 and examination apparatus 18), and the control of the wafer handling apparatus 19 are performed independently of each other. Based on this concept, the transfer schedule creating portion 54 of the controller 41 creates an optimum transfer schedule including the first lot as well, in light of the throughput. Then, the transfer operations are controlled in accordance with the transfer schedule thus created.

Specifically, the schedule creating portion 54 creates a transfer schedule by individually adjusting the operation timing of the FOUP transfer apparatus 12, the operation timings at the wafer access stages 15, such as opening of a lid by the lid opening/closing mechanism 17 and examination by the examination apparatus 18, and the operation timing of the wafer handling apparatus 19, such that, in a state while one lot of wafers are treated in the processing system, but the FOUP transfer apparatus 12 and the loading wafer access stage 15 are unoccupied, a FOUP F with a subsequent lot of unprocessed wafers stored therein is transferred onto the loading wafer access stage 15, thereby making the total transfer time pertinent. Adjustment of operation timings may be performed, where a transfer operation of one lot overlaps with a transfer operation of the subsequent lot, by shifting one of the operation timings.

For example, where the unloading operation of the first lot and the loading operation of the second lot are performed in parallel, the second lot of wafers are loaded at a timing when the FOUP transfer apparatus 12 is unoccupied and thus the second lot of wafers can be loaded. Then, the operation of the FOUP transfer apparatus 12, the operations at the wafer access stages 15 (the lid opening/closing mechanism 17 and examination apparatus 18), and the operation of the wafer handling apparatus 19 are scheduled for both of the loading side and unloading side to minimize the transfer time of the wafers. If such scheduling includes an overlap of the unloading operation of the first lot with the loading operation of the second lot at any one of the apparatuses, it is set to perform one of the operations prior to the other of the operations. Consequently, the apparatuses can be efficiently used to shorten the transfer sequence.

Figure 10:
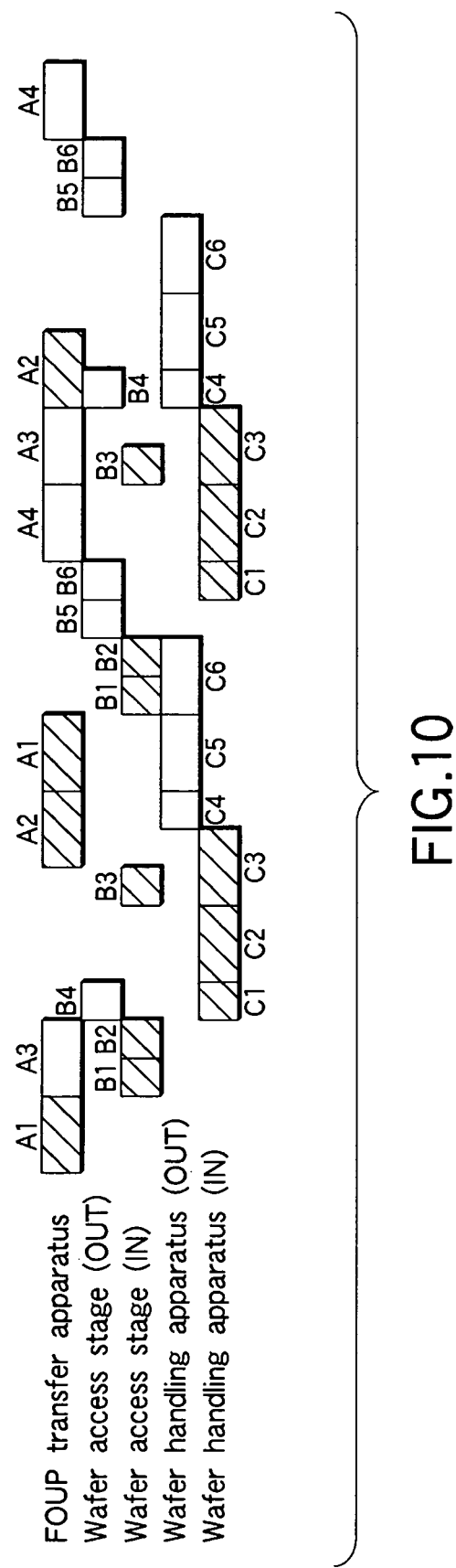
FIG. 10 is a timing chart showing a transfer sequence which can be realized by the cleaning process system according to an embodiment of the present invention.

Specifically, as shown in FIG. 10, in the unloading operation of the first lot, an unoccupied period of the FOUP 12, before the operation A3 of the FOUP transfer apparatus 12, is utilized to insert therein the transfer operation (operation A1) of the FOUP of the second lot. Then, at the wafer access stages 15, the FOUP F lid opening operation (operation B1) is performed by the lid opening/closing mechanism 17 and the examination operation (operation B2) is performed by the examination apparatus 18. Simultaneously with these operations, the transfer operation (operation A3) of transferring an empty FOUP F onto the unloading wafer access stage 15 is performed by the FOUP transfer apparatus 12, and then the lid opening operation (operation B4) of the empty FOUP F is performed.

As shown in FIG. 8, according to the conventional transfer sequence, in the subsequent operation of the wafer handling apparatus 19, the unloading operation of the first lot overlaps with the loading operation of the second lot. On the other hand, according to this embodiment, in order to prevent an overlap from occurring in the schedule of the wafer handling apparatus 19, the operations C1 to C3 for the second lot are first performed by the wafer handling apparatus 19 to transfer the unprocessed wafers W onto the first arraying mechanism 21a. Thereafter, transfer operations (operations C4 to C6) are performed such that the first lot of wafers W processed by the cleaning process are picked up by the wafer handling apparatus 1,9 from the second arraying mechanism 21b and are inserted into a FOUP F on the unloading wafer access stage 15. Consequently, the wafer transfer operations, particularly the wafer loading operation, can be performed in a short time, thereby improving the throughput of the entire process.

According to the embodiment of the present invention described above, the operation timing of a container transfer apparatus, the operation timings at a substrate access area, and the operation timing of the substrate handling apparatus are individually adjusted such that, in a state while one lot of substrates are treated in the processing system, but the container transfer apparatus and the substrate access area are unoccupied, a container with a subsequent lot of unprocessed substrates stored therein is transferred onto the substrate access area, thereby making the total transfer time pertinent. Consequently, the substrate transfer operations can be performed in a short time as far as possible, thereby improving the throughput of the entire process.

The present invention is not limited to the embodiment described above, and it may be modified in various manners. For example, in the embodiment described above, the present invention is applied to a cleaning process system, but the present invention may be applied to another apparatus in which a plurality of substrates stored in a container are taken out and then processed. In the embodiment described above, one lot of wafers undergoing each process are formed of wafers of two FOUPs, but one lot of wafers undergoing each process may be formed of wafers of one FOUP. In the embodiment described above, the wafer handling apparatus has a multi-axial structure, but this is not limiting.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing system comprising:
   a container load port section for loading and unloading a container for storing a plurality of substrates;
   a substrate access area for taking out a plurality of unprocessed substrates from a container and for inserting processed substrates into an empty container;
   a container transfer apparatus configured to transfer a container between the container load port section and the substrate access area;
   a process section configured to perform a predetermined process on a plurality of substrates together;
   a substrate delivery area for loading a plurality of unprocessed substrates into the process section and for unloading processed substrates from the process section;
   a substrate handling apparatus configured to transfer substrates from a container at the substrate access area to the substrate delivery area and to transfer substrates from the substrate delivery area into a container at the substrate access area;
   a substrate transfer mechanism configured to transfer substrates between the substrate delivery area and the process section; and
   a control section configured to control a series of transfer operations of transferring a container that stores unprocessed substrates to the substrate access area and then transferring the unprocessed substrates from this container to the substrate delivery area, and of transferring an empty container to the substrate access area, then transferring processed substrates from the substrate delivery area into this empty container, and then transferring the container that stores the processed substrates,
   wherein the control section is preset to control the container transfer apparatus, an operation at the substrate access area, and the substrate handling apparatus independently of each other, and
   the control section includes a schedule creating portion configured to create a transfer schedule by individually adjusting operation timing of the container transfer apparatus, operation timing at the substrate access area, and operation timing of the substrate handling apparatus such that, in a state in which a first lot of substrates is treated in the processing system, but the container transfer apparatus and the substrate access area are unoccupied, a container with a second lot of unprocessed substrates stored therein is transferred onto the substrate access area, thereby minimizing total transfer time.

2. The substrate processing system according to claim 1, wherein, where a transfer operation of the first lot overlaps with a transfer operation of the second lot, their operation timings are adjusted by shifting one of the operation timings.

3. The substrate processing system according to claim 1, wherein the schedule creating portion is designed to create a schedule to perform a loading operation of the second lot of substrates before starting an unloading operation of the first lot of substrates.

4. The substrate processing system according to claim 3, wherein the substrate access area includes a first stage for placing a container that stores unprocessed substrates and a second stage for placing an empty container that receives processed substrates, and the schedule creating portion is designed to create a schedule to transfer a container that stores unprocessed substrates to the first stage to perform the loading operation of the second lot of substrates, immediately before transferring an empty container to the second stage to perform the unloading operation of the first lot of substrates.

5. The substrate processing system according to claim 1, wherein the substrate delivery area includes a substrate loading position for loading unprocessed substrates into the process section and a substrate unloading position for unloading processed substrates from the process section.

6. The substrate processing system according to claim 5, wherein the substrate delivery area includes a first holding portion configured to receive substrates from the substrate handling apparatus, to hold unprocessed substrates of two containers with a half pitch that is a half of a substrate array pitch inside the containers, and to transfer the unprocessed substrates held with the half pitch onto the substrate transfer mechanism at the substrate loading position; and a second holding portion configured to receive processed substrates from the substrate transfer mechanism, which holds processed substrates arrayed with the half pitch, at the substrate unloading position, and to hold substrates corresponding to one container at a time, and
   the schedule creating portion is designed to create a schedule to load unprocessed substrates by performing a series of operations of taking out unprocessed substrates of one container and transferring these substrates to the first holding portion, then performing the same operations for transferring unprocessed substrates from a subsequent container to the first holding portion, and arraying these substrates with the half pitch by the first holding portion; and to unload processed substrates by using the second holding portion to separate processed substrates of the two containers, arrayed with the half pitch, into two sets of substrates each corresponding to one container with the substrate array pitch inside the containers, then performing a series of operations of inserting one of the two sets of substrates into a container, and then performing the same operations for inserting the other of the two sets of substrates into another container.

7. The substrate processing system according to claim 1, wherein the substrate handling apparatus includes substrate holding arms configured to hold substrates corresponding to one container and a multi-axial structure that allows the substrate holding arms to take an arbitrary position and posture in a three-dimensional space.

8. The substrate processing system according to claim 1, wherein the system further comprises a lid opening/closing mechanism configured to open and close a lid of a container at the substrate access area, and a substrate examination apparatus configured to examine substrates inside a container at the substrate access area, and the operation at the substrate access area comprises opening and closing of a lid of a container by the lid opening/closing mechanism and examination of substrates inside a container by the examination apparatus.

9. The substrate processing system according to claim 1, wherein the container load port section includes a container holding portion for temporarily placing a container.

10. A substrate transfer method in a substrate processing system,
    the substrate processing system comprising
    a container load port section for loading and unloading a container for storing a plurality of substrates,
    a substrate access area for taking out a plurality of unprocessed substrates from a container and for inserting processed substrates into an empty container,
    a container transfer apparatus configured to transfer a container between the container load port section and the substrate access area,
    a process section configured to perform a predetermined process on a plurality of substrates together, a substrate delivery area for loading a plurality of unprocessed substrates into the process section and for unloading processed substrates from the process section, a substrate handling apparatus configured to transfer substrates from a container at the substrate access area to the substrate delivery area and to transfer substrates from the substrate delivery area into a container at the substrate access area, and a substrate transfer mechanism configured to transfer substrates between the substrate delivery area and the process section, the substrate transfer method comprising:

transferring a container that stores unprocessed substrates to the substrate access area and then transferring the unprocessed substrates from this container to the substrate delivery area;

transferring an empty container to the substrate access area, then transferring processed substrates from the substrate delivery area into this empty container, and then transferring the container that stores the processed substrates; and individually adjusting operation timing of the container transfer apparatus, operation timing at the substrate access area, and operation timing of the substrate handling apparatus such that, in a state in which a first lot of substrates is treated in the processing system, but the container transfer apparatus and the substrate access area are unoccupied, a container with a second lot of unprocessed substrates stored therein is transferred onto the substrate access area, thereby minimizing total transfer time.

11. The substrate transfer method according to claim 10, wherein, where a transfer operation of the first lot overlaps with a transfer operation of the second lot, their operation timings are adjusted by shifting one of the operation timings.

12. The substrate transfer method according to claim 10, wherein the method is arranged to perform a loading operation of the second lot of substrates before starting an unloading operation of the first lot of substrates.

13. The substrate transfer method according to claim 12, wherein the substrate access area includes a first stage for placing a container that stores unprocessed substrates and a second stage for placing an empty container that receives processed substrates, and the method is arranged to transfer a container that stores unprocessed substrates to the first stage to perform the loading operation of the second lot of substrates, immediately before transferring an empty container to the second stage to perform the unloading operation of the first lot of substrates.

14. The substrate transfer method according to claim 10, wherein the substrate delivery area includes a substrate loading position for loading unprocessed substrates into the process section and a substrate unloading position for unloading processed substrates from the process section.

15. The substrate transfer method according to claim 14, wherein the substrate delivery area includes a first holding portion configured to receive substrates from the substrate handling apparatus, to hold unprocessed substrates of two containers with a half pitch that is a half of a substrate array pitch inside the containers, and to transfer the unprocessed substrates held with the half pitch onto the substrate transfer mechanism at the substrate loading position, and a second holding portion configured to receive processed substrates from the substrate transfer mechanism, which holds processed substrates arrayed with the half pitch, at the substrate unloading position, and to hold substrates corresponding to one container at a time, and the method is arranged to load unprocessed substrates by performing a series of operations of taking out unprocessed substrates of one container and transferring these substrates to the first holding portion, then performing the same operations for transferring unprocessed substrates from a subsequent container to the first holding portion, and arraying these substrates with the half pitch by the first holding portion; and to unload processed substrates by using the second holding portion to separate processed substrates of the two containers, arrayed with the half pitch, into two sets of substrates each corresponding to one container with the substrate array pitch inside the containers, then performing a series of operations of inserting one of the two sets of substrates into a container, and then performing the same operations for inserting the other of the two sets of substrates into another container.

16. A computer readable non-transitory storage medium containing a program for controlling transfer of substrates in a substrate processing system, the substrate processing system comprising a container load port section for loading and unloading a container for storing a plurality of substrates, a substrate access area for taking out a plurality of unprocessed substrates from a container and for inserting processed substrates into an empty container, a container transfer apparatus configured to transfer a container between the container load port section and the substrate access area, a process section configured to perform a predetermined process on a plurality of substrates together, a substrate delivery area for loading a plurality of unprocessed substrates into the process section and for unloading processed substrates from the process section, a substrate handling apparatus configured to transfer substrates from a container at the substrate access area to the substrate delivery area and to transfer substrates from the substrate delivery area into a container at the substrate access area, and a substrate transfer mechanism configured to transfer substrates between the substrate delivery area and the process section, wherein the program, when executed, causes a computer to control the substrate processing system to conduct a substrate transfer method comprising:

transferring a container that stores unprocessed substrates to the substrate access area and then transferring the unprocessed substrates from this container to the substrate delivery area;

transferring an empty container to the substrate access area, then transferring processed substrates from the substrate delivery area into this empty container, and then transferring the container that stores the processed substrates; and individually adjusting operation timing of the container transfer apparatus, operation timing at the substrate access area, and operation timing of the substrate handling apparatus such that, in a state in which a first lot of substrates is treated in the processing system, but the container transfer apparatus and the substrate access area are unoccupied, a container with a second lot of unprocessed substrates stored therein is transferred onto the substrate access area, thereby minimizing total transfer time.

* * * * *